US008357586B2

(12) United States Patent
Akiyama et al.

(10) Patent No.: US 8,357,586 B2
(45) Date of Patent: Jan. 22, 2013

(54) METHOD FOR MANUFACTURING SOI WAFER

(75) Inventors: Shoji Akiyama, Gunma (JP); Yoshihiro Kubota, Gunma (JP); Atsuo Ito, Tokyo (JP); Kouichi Tanaka, Gunma (JP); Makoto Kawai, Gunma (JP); Yuji Tobisaka, Gunma (JP); Hiroshi Tamura, Gunma (JP)

(73) Assignee: Shin-Etsu Chemical Co., Ltd. (JP)

( * ) Notice: Subject to any disclaimer, the term of this patent is extended or adjusted under 35 U.S.C. 154(b) by 10 days.

(21) Appl. No.: 12/920,363

(22) PCT Filed: Mar. 23, 2009

(86) PCT No.: PCT/JP2009/055663
§ 371 (c)(1),
(2), (4) Date: Aug. 31, 2010

(87) PCT Pub. No.: WO2009/116664
PCT Pub. Date: Sep. 24, 2009

(65) Prior Publication Data
US 2011/0003462 A1    Jan. 6, 2011

(30) Foreign Application Priority Data

Mar. 21, 2008   (JP) .................................. 2008-074501
Mar. 21, 2008   (JP) .................................. 2008-074646

(51) Int. Cl.
*H01L 21/46*      (2006.01)
*H01L 21/30*      (2006.01)
*H01L 21/762*     (2006.01)

(52) U.S. Cl. ................. 438/455; 438/459; 257/E21.568; 257/E21.569; 257/E21.567

(58) Field of Classification Search .................. 438/455, 438/459; 257/E21.567, E21.568, E21.569
See application file for complete search history.

(56) References Cited

U.S. PATENT DOCUMENTS
6,372,609 B1 *  4/2002  Aga et al. ...................... 438/459
(Continued)

FOREIGN PATENT DOCUMENTS
EP           1187216 A1    3/2002
(Continued)

OTHER PUBLICATIONS

International Search Report corresponding to International Application No. PCT/JP2009/055663 mailed Apr. 28, 2009.

(Continued)

*Primary Examiner* — Luan C Thai
(74) *Attorney, Agent, or Firm* — Myers Bigel Sibley & Sajovec, PA

(57) ABSTRACT

Provided is a method for manufacturing an SOI wafer, which is capable of: efficiently removing an ion-implanted defect layer existing in an ion implanted layer in the vicinity of a peeled surface peeled by an ion implantation peeling method; ensuring the in-plane uniformity of a substrate; and also achieving cost reduction and higher throughput. The method for manufacturing an SOI wafer includes at least the steps of: bonding a silicon wafer with or without an oxide film onto a handle wafer to prepare a bonded substrate, wherein the silicon wafer has an ion implanted layer formed by implanting hydrogen ions and/or rare gas ions into the silicon wafer; peeling the silicon wafer along the ion implanted layer, thereby transferring the silicon wafer onto the handle wafer to produce a post-peeling SOI wafer; immersing the post-peeling SOI wafer in an aqueous ammonia-hydrogen peroxide solution; and performing a heat treatment at a temperature of 900° C. or higher on the immersed post-peeling SOI wafer, and/or polishing a silicon film layer of the immersed post-peeling SOI wafer, through CMP polishing by 10 to 50 nm.

12 Claims, 5 Drawing Sheets

U.S. PATENT DOCUMENTS

| | | |
|---|---|---|
| 2006/0118935 A1 | 6/2006 | Kamiyama et al. |
| 2008/0299376 A1 | 12/2008 | Ito et al. |
| 2009/0023269 A1 | 1/2009 | Morimoto et al. |

FOREIGN PATENT DOCUMENTS

| | | |
|---|---|---|
| EP | 1635396 A1 | 3/2006 |
| EP | 1688990 A2 | 8/2006 |
| JP | 2004-311526 | 11/2004 |
| WO | WO 2005/024925 A1 | 3/2005 |
| WO | WO 2007/074550 A1 | 7/2007 |

OTHER PUBLICATIONS

Supplementary European Search Report corresponding to European Application No. 09722529.6 dated May 19, 2011.

Aspar et al., Basic mechanisms involved in the Smart-Cut® process, Microelectronic Engineering, (1997), vol. 36, pp. 233-240.

Miyashita et al., Dependence of Thin Oxide Films Quality on Surface Micro-Roughness, Symp VLSI Technol, (1991), pp. 45-46.

Ohmi et al., SOI No Kagakuk, Realize Science & Engineering Center Col, Ltd. (2002), pp. 59-66, Concise Explanation, Section 2, Paragraph 2.

Ryuta et al., Effect of Crystal Pulling Rate on Formation of Crystal-Originated "Particles" on Si Wafers, Japanese Journal of Applied Physics, (1992), vol. 31, pp. L293-L295.

Nobuhiko et al., Hydrogen annealed silicon-on insulator, Applied Physics Letters, (1994), vol. 65, No. 15, pp. 1924-1926.

* cited by examiner

METHOD FOR MANUFACTURING SOI WAFER

RELATED APPLICATIONS

This application is a 35 U.S.C. §371 national stage application of PCT Application No. PCT/JP2009/055663, filed on Mar. 23, 2009, which claims priority from Japanese Application No. 2008-074501 filed Mar. 21, 2008 and Japanese Application No. 2008-074646 filed Mar. 21, 2008, the contents of which are incorporated herein by reference in their entireties. The above-referenced PCT International Application was published as International Publication No, WO 2009/116664 A1 on Sep. 24, 2009.

TECHNICAL FIELD

The present invention relates to a method for manufacturing an SOI wafer, and particularly relates to a method for manufacturing an SOI wafer with improvement in treating a surface of a silicon film thinned and transferred by an ion implantation.

BACKGROUND ART

Silicon on insulator (SOI) substrates have been widely employed for devices so as to reduce parasitic capacitance, thereby achieving higher speed performance and improved power consumption.

In these years, there has been an increasing demand for a thin SOI wafer with an SOI layer (silicon layer) of 100 nm or thinner so as to fabricate a fully-depleted SOI device. This is because thinning an SOI layer expectedly leads to higher-speed performance of a device.

Along with the thinning of SOI layers, the in-plane thickness uniformity is demanded more strictly.

Generally, a thin film-SOI wafer is manufactured by the SOITEC process or the SiGen process. In such a process, hydrogen ions are implanted into a donor wafer in advance, the donor wafer is subsequently bonded onto a handle wafer, and a film is transferred from the donor side to the handle side along the hydrogen ion-implanted interface. In this event, however, approximately around 0.1 μm of an ion-implanted defect layer (amorphous layer) is left in the silicon thin film thus transferred, and an RMS surface roughness of approximately several nanometers or higher is introduced onto the surface of the thin film (see, for example, B. Asper "Basic Mechanisms involved in the Smart-Cut(R) process," Microelectronics Engineering, 36, p233 (1997)).

In this respect, the SOITEC process is carried out as follows. Specifically, both donor and handle wafers are bonded together at room temperature. Then, the wafers are heated to around 500° C. to form air holes, called microcavities, in the hydrogen-implanted interface, thereby causing thermal peeling. Thus, a film is transferred.

Meanwhile, the SiGen process is carried out as follows. Specifically, as a pretreatment of bonding both donor and handle wafers, the donor and handle wafers are subjected to a plasma-surface activation treatment, and the two are bonded (laminated) at room temperature. At this point, they achieve a strong bonding strength. A low-temperature (around 300° C.) heat treatment is performed if necessary. Then, a mechanical impact is applied to a hydrogen ion-implanted interface for peeling, so that a film is transferred. Since the SiGen process can be a low temperature process compared to the SOITEC process, the SiGen process is a method suitable for manufacturing a laminate (for example, silicon on quartz: SOQ) by bonding wafers having different thermal expansion coefficients.

Here, as described above, in the SOITEC process and the SiGen process, an ion-implanted defect layer which is introduced by the ion implantation exists on a surface portion of the peeled surface. Several methods for removing such a defect layer and smoothing the surface have been proposed.

One method is to polish a surface portion by approximately 0.1 μm that is approximately the same thickness as the thickness of an ion-implanted defect layer, thereby removing the ion-implanted defect layer. However, this method has a problem that in-plane uniformity in the thickness of the remaining film is hard to achieve due to unevenness in polishing.

As the other method, a method is conceived in which the crystallinity of a damaged layer is recovered by a high temperature heat treatment, then the surface is subjected to polishing by several tens of nm, called "touch polishing", to eliminate the asperity of the surface. It is also reported that the surface can be smoothed, in this event, using hydrogen or the like as an atmosphere gas without being subjected to the touch polishing step (see, for example, Nobuhiko Sato and Takao Yonehara "Hydrogen annealed silicon-on-insulator," Appl Phys Lett Vol 65, pp. 1924 (1994)).

However, as including the high temperature hydrogen heat treatment step, the above different method involves new problems such as metal contamination, warpage of the resulting substrate, increase in the manufacturing cost, reduction in the throughput, and so forth. Furthermore, this method has a disadvantage that uniformity in thickness between substrates, or uniformity in in-plane thickness of a substrate is hard to achieve, because the hydrogen gas etches silicon.

Moreover, if the handle wafer is an SOI wafer made of a low melting point material (such as quartz and glass) other than silicon, the handle wafer can not be subjected to such an additional high temperature heat treatment. Thus, the problem thereof is further serious.

Meanwhile, it is reported that according to observation by an AFM, a surface roughness of approximately 8 nm in RMS and asperity of approximately 64.5 nm in Peak to Valley (P-V) generally exist in a 1×1-μm area of a surface of an SOI wafer manufactured by a hydrogen ion-implantation method (the SOITEC process, the SiGen process, or the like), wherein the surface observed by an AFM is one immediately after transfer of the film (see, for example, "Science of SOI" Chapter 2, Realize Science & Engineering Center Co., Ltd.). Considering that the asperity of 64.5 mm exists even in such a small area of 1×1 μm, presumably a greater asperity (100 nm or more) would exist in the entire surface of the wafer. For this reason, the in-plane roughness of the surface needs to be reduced.

DISCLOSURE OF THE INVENTION

Problem to be Solved by the Invention

The present invention has been made in view of the above problems. An object of the present invention is to provide a method for manufacturing an SOI wafer, which the method is capable of: efficiently removing an ion-implanted defect layer existing in an ion implanted layer in the vicinity of a surface peeled by an ion implantation peeling method; ensuring the in-plane uniformity of a substrate; and also achieving cost reduction and higher throughput.

Means for Solving the Problem

To solve the above problems, the present invention provides a method for manufacturing an SOI wafer, comprising at least the steps of: bonding a silicon wafer with or without an oxide film onto a handle wafer to prepare a bonded substrate, wherein the silicon wafer has an ion implanted layer formed by implanting hydrogen ions and/or rare gas ions into the silicon wafer; peeling the silicon wafer along the ion implanted layer, thereby transferring the silicon wafer onto the handle wafer to produce a post-peeling SOI wafer; immersing the post-peeling SOI wafer in an aqueous ammonia-hydrogen peroxide solution; and performing a heat treatment at a temperature of 900° C. or higher on the immersed post-peeling SOI wafer, and/or polishing a silicon film layer of the immersed post-peeling SOI wafer through CMP polishing by 10 to 50 nm.

As described above, the post-peeling SOI wafer containing the silicon film is immersed in the aqueous ammonia-hydrogen peroxide solution, the silicon film having been peeled by an ion implantation peeling method. Consequently, the aqueous ammonia-hydrogen peroxide solution etches a highly damaged layer which exists in the surface of the silicon film of the post-peeling SOI wafer and which has a high amorphousness and many ion-implanted defects. The aqueous ammonia-hydrogen peroxide solution has a lower etching rate than an alkali solution such as KOH. Accordingly, an amount of etching can be easily controlled, allowing etching to achieve in-plane uniformity. Thus, the in-plane thickness uniformity after the etching can be ensured, and the ion-implanted damaged layer can be removed. When an annealing heat treatment is then performed on the post-peeling SOI wafer with the surface roughness being reduced (in preferable first aspect), the heat treatment can be performed at a lower annealing temperature for a shorter annealing time period. Thus, the method for manufacturing an SOI wafer is capable of reducing metal contamination and warpage of the wafer, and achieving cost reduction. Moreover, when touch polishing is performed through CMP polishing (in preferable second aspect), an ion-implanted damaged layer is removed while the in-plane thickness uniformity is ensured. Thus, it is possible to obtain an SOI wafer in which the variation in in-plane thickness is suppressed in comparison with conventional wafers. In a preferable third aspect, the post-peeling SOI wafer can be subjected to an annealing heat treatment and then to touch polishing through CMP polishing.

Furthermore, since the step of immersing in the aqueous ammonia-hydrogen peroxide solution can be batch-processed, a large number of post-peeling SOI wafers can be processed at once. Thus, the method for manufacturing an SOI wafer is capable of achieving cost reduction and higher throughput.

Effects of the Invention

As has been described above, in a method for manufacturing an SOI wafer of the present invention, a post-peeling SOI wafer is immersed in an aqueous ammonia-hydrogen peroxide solution that has a lower etching rate than an alkali solution. Accordingly, an amount of etching can be easily controlled, allowing etching to achieve in-plane uniformity. Thus, the in-plane thickness uniformity after the etching can be ensured. Hence, it is possible to obtain an SOI wafer in which the variation in in-plane thickness is suppressed in comparison with conventional wafers.

MODES FOR CARRYING OUT THE INVENTION

Hereinafter, the present invention will be described more specifically.

As described above, a method for manufacturing an SOI wafer has been long waited to be developed, which is capable of efficiently removing an ion-implanted defect layer existing in an ion implanted layer in the vicinity of a surface peeled by an ion implantation peeling method, and also capable of ensuring in-plane uniformity of a substrate.

Hence, the present inventors have focused on a high amorphousness of an ion-implanted damaged layer in a surface of a silicon film of a post-peeling SOI wafer and earnestly studied an etching solution capable of preferentially etching amorphous silicon.

As a result, the present inventors have found out the following fact. Specifically, an aqueous ammonia-hydrogen peroxide solution, which is generally known to deteriorate the surface roughness of a mirror-finished silicon surface (reference documents: J. Ryuta, E. Morita, T. Tanaka, and Y. Shimanuki, Jpn. J. Appl. Phys. 29 (1991) and M. Miyashita, M. Itano, T. Imaoka, I. Kawanabe and T. Ohmi, 1991 Symp. VLSI Technol. (Oiso 1991) p. 45), preferentially etches a highly-damaged layer in such a manner as to reduce roughness of the rough surface immediately after a film is transferred by an ion implantation method. Thus, the present invention is completed.

Hereinbelow, a method for manufacturing an SOI wafer of the present invention will be described with reference to FIG. 1. However, the present invention is not limited thereto.

FIG. 1 shows one example of each step in the method for manufacturing an SOI wafer of the present invention.

(Step a: Preparation of Bonded Substrate)

Figure 1A:
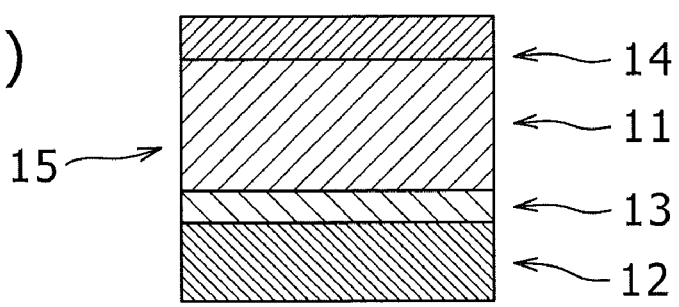
FIG. 1 is a flowchart showing the outline of the manufacturing method for an SOI wafer of the present invention.
Figure 1B:
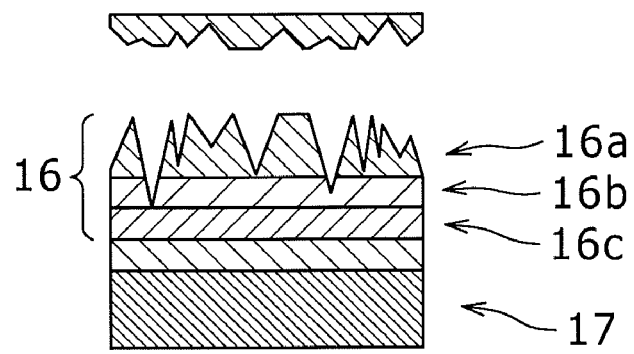
Figure 1C:
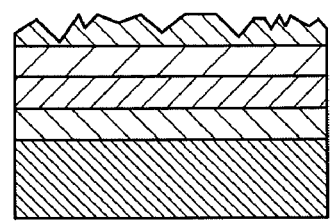

First, as shown in FIG. 1(a), a bonded substrate 15 is prepared by bonding a silicon wafer 11 onto a handle wafer 12. An ion implanted layer 14 is formed by implanting hydrogen ions and/or rare gas ions into the silicon wafer 11.

Here, in the bonded substrate 15 to be prepared, an oxide film 13 may be formed between the silicon wafer 11 and the handle wafer 12. FIG. 1 illustrates an example where the oxide film 13 is provided. However, this oxide film 13 is not always necessary so that the bonded substrate may be prepared by directly bonding a silicon wafer and a handle wafer together.

Meanwhile, in the preparation of the bonded substrate, a handle wafer may be made of any material of silicon, sapphire, alumina, quartz, SiC, aluminum nitride, and glass.

As will be described later, in a first embodiment of the present invention, a post-peeling SOI wafer is immersed in an aqueous ammonia-hydrogen peroxide solution and thus etched. For this reason, the SOI wafer can ensure the in-plane thickness uniformity after the etching, and thus can be subjected to an annealing heat treatment while having the smaller surface roughness. Accordingly, the subsequent heat treatment step can be performed at a lower temperature for a shorter period of time in comparison with conventional step. Hence, the substrate used is not limited to silicon, and low-melting-point materials and different kinds of substances such as quartz and glass can be used. Since the annealing heat treatment can be performed at a lower temperature for a shorter period of time in comparison with the conventional treatment, the aforementioned insulating but low melting point materials can be used as the handle wafer. Moreover, since an insulating material as mentioned above can be used as the handle wafer, flow of leakage current in the SOI substrate can be more likely suppressed than in a case where a silicon wafer is used as the handle wafer. Thus, power consumption saving is achieved in a device to be fabricated afterwards.

As will be described later, in a preferable second embodiment of the present invention, a post-peeling SOI wafer is immersed in an aqueous ammonia-hydrogen peroxide solution and thus etched. By setting the etching amount to 50 nm or larger, a post-peeling SOI wafer is obtainable which is excellent in in-plane thickness uniformity without being subjected to a heat treatment such as annealing. This enables obtaining an SOI wafer excellent in in-plane uniformity without performing such a heat treatment. This makes it possible to use, as the substrate, not only silicon but low melting point materials and different kinds of substances such as quartz and glass. Moreover, since an insulating material as mentioned above can be used as the handle wafer, it is possible to suppress flowing of leakage current in the SOI substrate. This allows higher precision and power consumption saving in a device to be fabricated afterwards. Since it is possible to obtain a post-peeling SOI wafer excellent in in-plane thickness uniformity without performing a heat treatment such as annealing, an insulating and low melting point material, for example, can be used as the handle wafer. Accordingly, when the insulating and low melting point material is selectively used depending on the purpose, use of such a material takes advantage of properties of the material, such as suppressing flowing of leakage current in the SOI substrate, which are not obtained in a case where a silicon wafer is used as the handle wafer. Thus, higher precision and power consumption saving are achieved in a device to be fabricated afterwards.

In a preferable third embodiment of the present invention, when being subjected to etching with an aqueous ammonia-hydrogen peroxide solution by preferably less than 50 nm, more preferably 20 nm or more but less than 50 nm, a post-peeling SOI wafer can be subjected to an annealing heat treatment and then to touch polishing through CMP polishing.

(Step b: Peeling)

Next, as shown in FIG. 1(*b*), the silicon wafer 11 in the bonded substrate 15 is thinned by being peeled along the ion implanted layer 14. Consequently, a silicon film 16 is transferred to the handle wafer 12. Thus, a post-peeling SOI wafer 17 is obtained.

The silicon film 16, obtained in this step, of the post-peeling SOI wafer 17 is formed of three layers, from the surface side: a highly damaged layer 16*a* having a high amorphousness and many ion-implanted defects due to the ion implantation; a less damaged layer 16*b* having an amorphousness and ion-implanted defects not as higher many as the highly damaged layer 16*a*; and a single crystalline non-damaged layer 16*c* having no ion-implanted damages.

(Step c: Immersion in Aqueous Ammonia-Hydrogen Peroxide Solution)

Next, as shown in FIG. 1(*c*), the post-peeling SOI wafer 17 is immersed in an aqueous ammonia-hydrogen peroxide solution, and thereby the highly damaged layer 16*a* of the silicon thin film 16 is etched.

When a heat treatment step is performed after the step of immersing in the aqueous ammonia-hydrogen peroxide solution, the step of immersing preferably comprises at least etching the post-peeling SOI wafer by 20 nm or more.

When an etching amount with the aqueous ammonia-hydrogen peroxide solution is 20 nm or more as described above, the highly damaged layer can be etched more reliably.

The step of immersing in the aqueous ammonia-hydrogen peroxide solution preferably comprises at least etching the post-peeling SOI wafer by 50 nm or more.

The aqueous ammonia-hydrogen peroxide solution has a lower etching rate than an alkali solution such as KOH. Accordingly, an etching amount is easily controlled, and the thickness uniformity is easily ensured. By causing such an aqueous ammonia-hydrogen peroxide solution to etch the silicon film by the amount of 50 mm or more, the layer in which a large amount of damages by the ion implantation peeling has been left can be etched.

Moreover, the aqueous ammonia-hydrogen peroxide solution into which the post-peeling SOI wafer is immersed may include containing, at a composition ratio based on a volume, at least: 0.05 to 2 of 29 wt % ammonia water; 0.01 to 0.5 of 30 wt % hydrogen peroxide water; and 10 of water. In this manner, silicon is etched by the competitive reaction of $NH_4OH$ and $H_2O_2$ in the aqueous ammonia-hydrogen peroxide solution having a composition as mentioned above. Thereby, etching can be performed so as to achieve in-plane uniformity. Accordingly, it is possible to obtain an SOI wafer more excellent in thickness uniformity.

Meanwhile, in this step, the etching rate of the silicon film can be adjusted by changing the compositions of $NH_4OH$ and $H_2O_2$.

For improving the throughput further, the etching rate needs to be at a certain level. For this purpose, it is desirable that 29 wt % $NH_4OH$ water be 0.05 or more, and that 30 wt % $H_2O_2$ water be 0.5 or less when $H_2O$ is 10. It is needless to say that the lower limit of $NH_4OH$ and the upper limit of $H_2O_2$ are not limited to the aforementioned ranges.

Immersing the post-peeling SOI wafer in the aqueous ammonia-hydrogen peroxide solution having such a composition ratio can achieve further improvement in the throughput, and reduce the manufacturing cost further.

(Step d: Heat Treatment or CMP Polishing)

Then, in the first embodiment of the present invention, as shown in FIG. 1(*d*), a heat treatment is performed on the post-peeling SOI wafer 17 after being immersed in the aqueous ammonia-hydrogen peroxide solution. Thus, an SOI wafer 10 having a leveled surface is obtained.

The heat treatment step can be performed preferably in any atmosphere of argon, nitrogen and helium, or in a gas mixture atmosphere thereof.

Performing the heat treatment in an inert gas atmosphere as described above has the following advantages. Specifically, the resistivity changes little before and after the heat treatment. Moreover, it is possible to obtain a high-quality SOI wafer having hardly any grown-in defects in the vicinity of the surface layer.

Moreover, the heat treatment step can be performed preferably in an oxygen atmosphere, or in a mixture atmosphere of oxygen and at least one gas of argon, nitrogen and helium.

Performing the heat treatment in an atmosphere containing oxygen as described above has the following advantages. Specifically, it is possible to cause excessive oxygen in the silicon surface to diffuse outwardly. This can increase the dielectric strength of the insulating oxide film of the SOI wafer. Thus, a high-quality SOI wafer can be obtained.

Furthermore, the heat treatment step can be performed preferably in a hydrogen atmosphere, or in a mixture atmosphere of hydrogen and at least one gas of argon, nitrogen and helium.

The heat treatment in an atmosphere containing hydrogen having a high migration effect into silicon atoms as described above has the following advantages. Specifically, it is possible to obtain an SOI wafer more excellent in in-plane thickness uniformity, while keeping both grown-in defects and surface roughness less.

In this manner, in the first embodiment of the present invention, a post-peeling SOI wafer is immersed in an aqueous ammonia-hydrogen peroxide solution and thus etched, and is subjected to the heat treatment thereafter.

As reasons for using the aqueous ammonia-hydrogen peroxide solution, the following two can be cited.

Normally, in a silicon film of an SOI wafer immediately after peeled, silicon nearer to the surface has a higher amorphousness, whereas silicon farther from the surface has a closer quality to that of single crystal. In this respect, the aqueous ammonia-hydrogen peroxide solution preferentially etches the portion having a high amorphousness. To be more specific, a protruding portion with a high surface roughness is etched earlier.

The other reason which can be cited is that the etching rate by a simple alkali solution as represented by KOH or the like is normally very high (>100 nm/min). For this reason, it is very difficult to control the etching rate of the simple alkali solution through operations such as lowering the concentration and the temperature, and it is thus difficult to uniformize the etching rate of the in-plane portion. On the other hand, the etching with the aqueous ammonia-hydrogen peroxide solution occurs by the competitive reactions of ammonia and hydrogen peroxide. Thus, etching can be performed so as to achieve in-plane uniformity. Moreover, since the etching rate of the aqueous ammonia-hydrogen peroxide solution is appropriately lower than that of a pure alkali solution, an etching amount can be controlled easily.

Thus, the etching amount can be controlled easily so that etching can be performed so as to achieve in-plane uniformity. Accordingly, the in-plane thickness uniformity after the etching can be ensured. Moreover, since the annealing heat treatment is performed on the post-peeling SOI wafer with the surface roughness being reduced, it is possible to perform the heat treatment with a lower annealing temperature for a shorter period of annealing time. Furthermore, the method for manufacturing an SOI wafer is capable of reducing metal contamination and warpage of a wafer, and achieving cost reduction. Specifically, a heat treatment for recovering a damaged layer conventionally requires approximately 1150° C. or higher; in contrast, the heat treatment therefor in the present invention requires only 900° C. or higher.

Figure 1D:
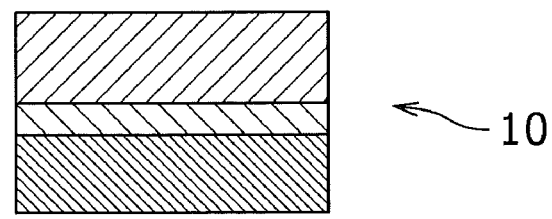

Meanwhile, in the second embodiment of the present invention, as shown in FIG. 1(d), CMP polishing is performed on the silicon film of the post-peeling SOI wafer 17 after being immersed in the aqueous ammonia-hydrogen peroxide solution. Consequently, an SOI wafer 10 is obtained. Here, in this step, the polishing amount is set to 10 to 50 nm. In other words, the polishing amount can be made small. This allows the surface roughness to be cleaned up without deteriorating the in-plane thickness uniformity so much, and thus allows the flatness to be improved.

As described above, in the second embodiment of the present invention, the etching of the ion-implanted damaged layer is performed by immersing the post-peeling SOI wafer in the aqueous ammonia-hydrogen peroxide solution. The reasons for using the aqueous ammonia-hydrogen peroxide solution are the same as above.

Thereafter, touch polishing is performed by the CMP polishing so as to remove only a small amount. Thereby, the ion-implanted damaged layer can be removed while the in-plane thickness uniformity is ensured. Thus, it is possible to obtain an SOI wafer in which the variation in in-plane thickness is suppressed in comparison with conventional wafers.

Moreover, since the step of immersing in the aqueous ammonia-hydrogen peroxide solution can be batch-processed, a large number of post-peeling SOI wafers can be processed at once. Thus, the method for manufacturing an SOI wafer is capable of achieving cost reduction and higher throughput.

In the third embodiment of the present invention, the post-peeling SOI wafer 17 is subjected to an annealing heat treatment and then to touch polishing through CMP polishing. Consequently, an SOI wafer 10 is obtained.

EXAMPLES

Hereinbelow, the method for manufacturing an SOI wafer of the present invention will be more specifically described based on Examples and Comparative Examples. However, the present invention, of course, is not limited thereto.

Examples 1, 2 and Comparative Examples 1, 2

Twenty post-peeling SOI wafers were prepared to which films had been transferred by an ion implantation method (each silicon film had a thickness of approximately 300 nm). The SOI wafers were divided into a group of ten for Examples and another group of ten for Comparative Examples.

Then, in Example, each of the ten post-peeling SOI wafers was immersed in an aqueous ammonia-hydrogen peroxide solution and thus etched by approximately 50 nm. In this respect, the aqueous ammonia-hydrogen peroxide solution had the composition of $NH_4OH:H_2O_2:H_2O=1:0.2:10$, and had a temperature of 80° C. Note that the ratios of $NH_4OH$ and $H_2O_2$ mean ratios of as an aqueous 29% $NH_4OH$ solution and an aqueous 30% aqueous $H_2O_2$ solution, respectively. Additionally, the etching rate in this event was approximately a little lower than 3 nm/min.

In contrast, in Comparative Examples, none of the ten post-peeling SOI wafers were immersed in an aqueous ammonia-hydrogen peroxide solution.

Subsequently, the post-peeling SOI wafers in Example and Comparative Example were subjected to heat treatments in which the temperature was changed within a range of 900° C. to 1200° C. (Example 1 and Comparative Example 1) (the treatment time period was fixed to one hour). The atmosphere gas was a mixture of 10% hydrogen and 90% argon. Meanwhile, the post-peeling SOI wafers in Example and Comparative Example were subjected to heat treatments in which the treatment temperature was set constant at 950° C., but the heat treatment period of time was changed in the aforementioned atmosphere (Example 2 and Comparative Example 2).

Thereafter, the following evaluations were carried out.

Figure 2A:
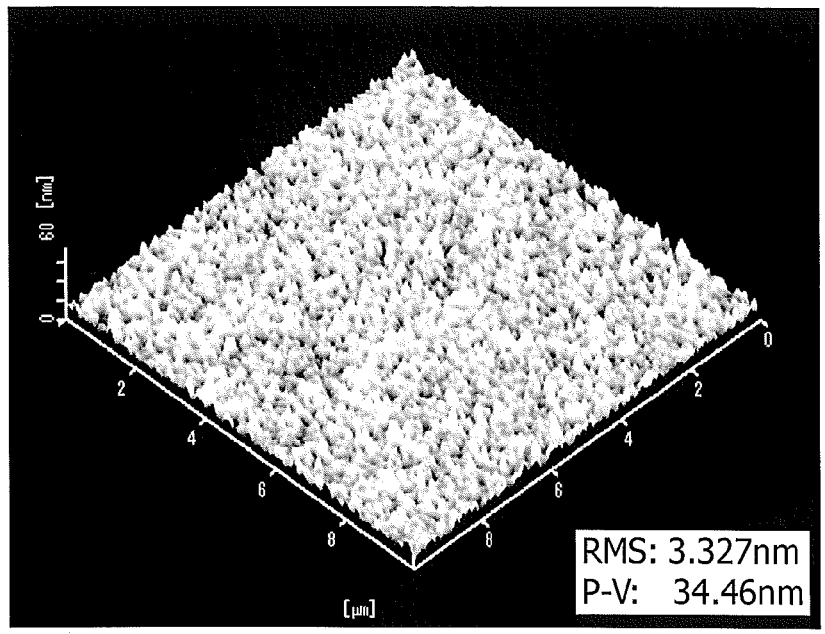
FIG. 2 shows pictures of surface images, observed by an AFM, of post-peeling SOI wafers in Example and Comparative Example before a heat treatment step.
Figure 2B:
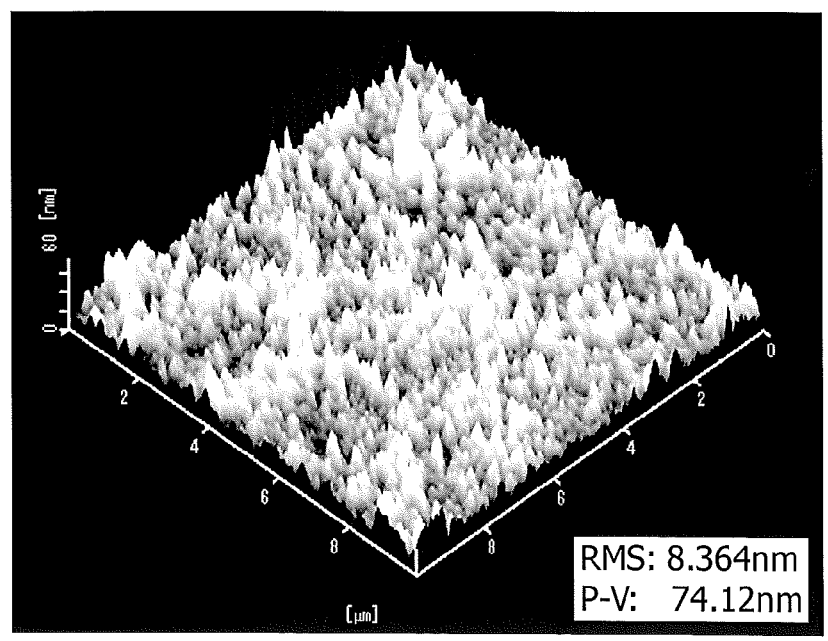

FIG. 2(a) shows the result of an AFM observation of a 10×10-μm area of the SOI wafer before the heat treatment step in Example. FIG. 2(b) shows an observation image of the SOI wafer before the heat treatment step in Comparative Example. FIG. 2 shows pictures of the surface images, observed by an AFM, of the post-peeling SOI wafers in Example and Comparative Example before the heat treatment step.

The surface roughness of the silicon film of the post-peeling SOI wafer in Comparative Example was 8.4 nm in RMS and 74.1 nm in the P-V value. An indefinite number of protrusions were observed under this AFM image observation.

The surface roughness of the post-peeling SOI wafer in Example was 3.3 nm in RMS and 34.5 nm in P-V. It was found out that the surface roughness was significantly reduced by etching with the aqueous ammonia-hydrogen peroxide solution in comparison with Comparative Example.

Figure 3:
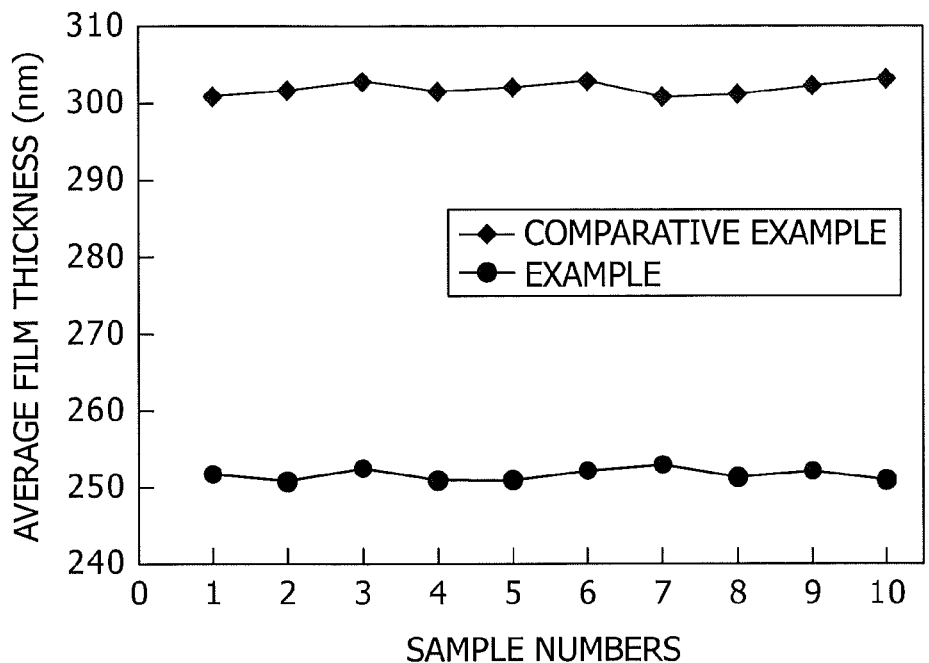
FIG. 3 is a drawing for comparing the change in thickness of silicon film before the heat treatment step between the post-peeling SOI wafers of Example and Comparative Example.

FIG. 3 shows the change in thickness (average of 361 points in a 200-mm surface of the wafer) of the silicon films of the SOI wafers before and after etching. FIG. 3 is a drawing for comparing the change in thickness of the silicon films before the heat treatment step between the post-peeling SOI wafers in Example and Comparative Example.

It was found out that there were fewer variations in thickness of the silicon films of the post-peeling SOI wafers before the heat treatment step among the samples in both Example and Comparative Example.

Figure 4:
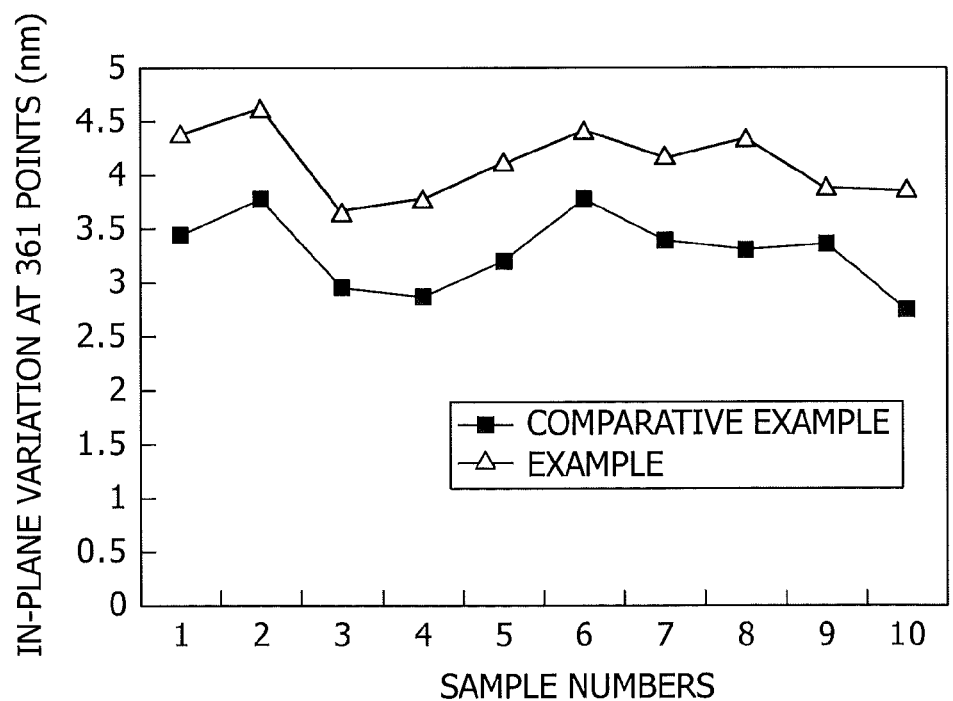
FIG. 4 is a drawing for comparing the in-plane thickness variation in the silicon thin films before the heat treatment step between the post-peeling SOI wafers of Example and Comparative Example.

Additionally, FIG. 4 shows the change in the in-plane thickness variation (average of 361 points in a 200-mm surface of the wafer) before and after etching. FIG. 4 is a drawing for comparing the in-plane thickness variation in the silicon films of the post-peeling SOI wafers before the heat treatment step, between the wafers in Example and Comparative Example.

The variation of the surfaces of the post-peeling SOI wafers in Examples increased by approximately 1 nm in comparison with the variation of the wafers in Comparative Examples in which no etching was performed. However, this is a sufficiently small value when compared with the etching amount (50 nm). Thus, it can be said that the in-plane thickness uniformity is sufficiently kept. In this manner, it was found out that the in-plane thickness uniformity of an SOI layer is not so worsened by the etching method of Examples.

Figure 5:
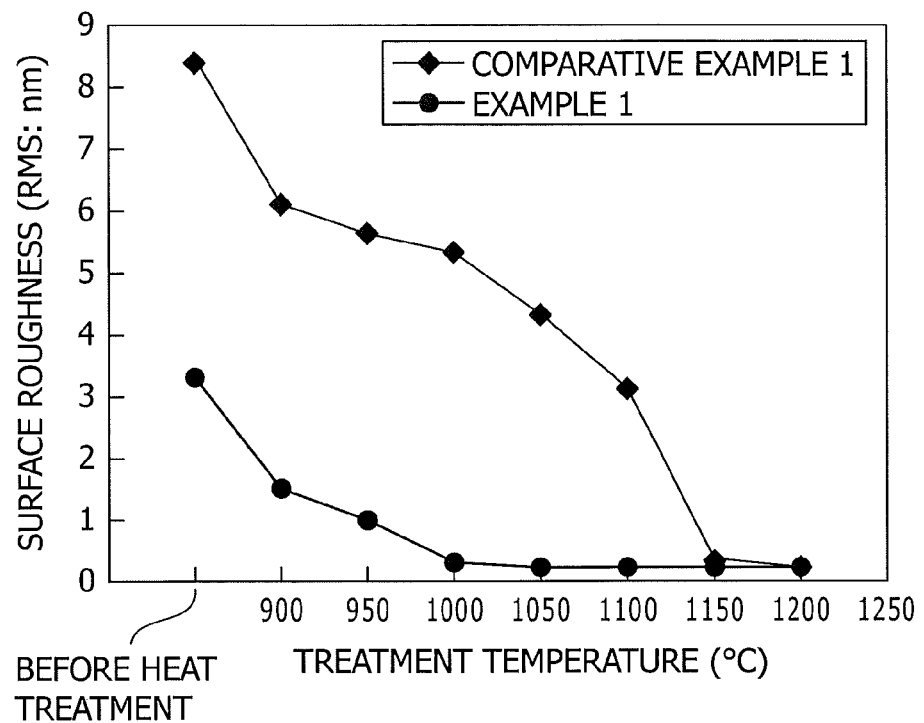
FIG. 5 is a drawing showing a relationship of the heat treatment temperature and the surface roughness of the SOI wafer after the heat treatment between SOI wafers of Example 1 and Comparative Example 1.

FIG. 5 shows a relationship between the treatment temperature and the surface roughness of the SOI wafer after the heat treatment in which the temperature was changed. FIG. 5 is a drawing showing the relationship of the heat treatment temperature and the surface roughness of the SOI wafer after the heat treatment between the SOI wafers in Example and Comparative Example.

It was found out that the effect of the heat treatment on the SOI wafers in Comparative Example became apparent at 1150° C., whereas the effect of the heat treatment on the SOI wafers in Example became apparent at 900° C. This indicates that a high temperature is needed to remove asperity of a large-sized protrusion. The SOI wafer in Example reveals that as far as such a large-sized protrusion is removed by etching with the aqueous ammonia-hydrogen peroxide solution, the heat treatment can be performed at a lower temperature.

Figure 6:
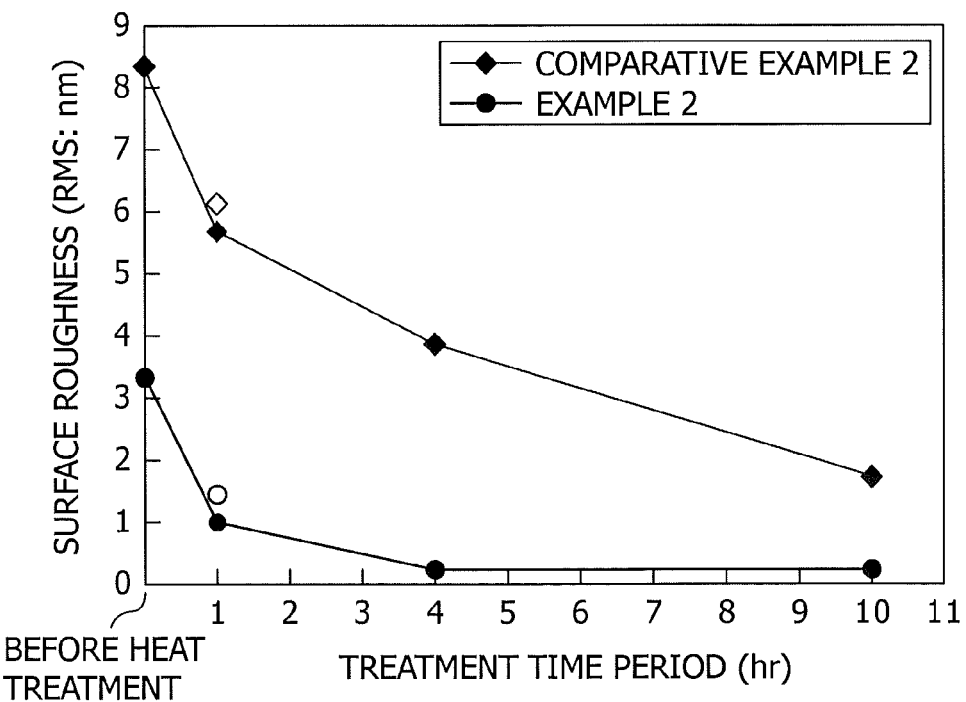
FIG. 6 is a drawing showing a relationship of the heat treatment time period and the surface roughness of the SOI wafer after the heat treatment between SOI wafers of Example 2 and Comparative Example 2.

The result is shown in FIG. 6. FIG. 6 is a drawing showing a relationship of the heat treatment period of time and the surface roughness of the SOI wafer after the heat treatment between the SOI wafers in Example and Comparative Example.

It was found out that, although the surface roughnesses in the wafers of both Example 2 and Comparative Example 2 were reduced with time, the roughness of the wafers of Example 2 subjected to the etching settled down to approximately 0.2 nm in RMS in approximately 4 hours. On the other hand, it was found out that the roughness of the wafer of Comparative Example 2 not subjected to the etching was reduced with time but at a very slow rate in comparison with Example 2.

Examples 3 to 7 and Comparative Examples 3 to 6

First, post-peeling SOI wafers were prepared to which films (each having a film thickness of approximately 310 nm) had been transferred by a hydrogen ion-implantation method.

Then, each of the prepared post-peeling SOI wafers was immersed in an aqueous ammonia-hydrogen peroxide solution and thus etched by 30 nm in Comparative Example 3, 40 nm in Comparative Example 4, 50 nm in Example 3, 70 nm in Example 4, or 85 nm in Examples 5 to 7 and Comparative Examples 5, 6. The aqueous ammonia-hydrogen peroxide solution had the composition of $NH_4OH:H_2O_2:H_2O=1:0.02:10$ and a temperature of 80° C. The etching rate of the silicon film was approximately a little lower than 3 nm/min.

Thereafter, the CMP polishing was performed, and thus SOI wafers were manufactured.

Here, the amounts of the silicon films polished in the CMP polishing step were 10 nm in Example 5, 25 nm in Example 6, 50 nm in Example 7, 60 nm in Comparative Example 5, and 70 nm in Comparative Example 6. Note that, this CMP polishing step was not performed on the post-peeling SOI wafers in Comparative Examples 3 and 4.

During and after the manufacturing of the SOI wafers, evaluations as described below were carried out.

The surfaces of the post-peeling SOI wafers in Examples 3 to 7 and Comparative Examples 3 to 6 were checked with a film thickness gauge before and after the step of immersing in the aqueous ammonia-hydrogen peroxide solution. Then, the thickness and in-plane thickness variation of the silicon films were evaluated. The scanning range of the film thickness gauge was 10×10 μm, and the average value of 361 points in the surface of the wafer was obtained. Note that, the in-plane thickness variation is defined by "maximum film thickness−minimum film thickness."

The surfaces of the SOI wafers in Examples 5 to 7 and Comparative Examples 5, 6 were checked with the film thickness gauge before and after the CMP polishing step. Then, the thickness and in-plane thickness variation of the silicon films were evaluated. The variation is defined as a difference between the largest value and the smallest value among the measured 361 points in the surface of the wafer.

Table 1 shows a relationship of the in-plane thickness variations with the etching amount, evaluating the in-plane thickness variations of the silicon films before and after the step of immersing the post-peeling SOI wafers in the ammonia-hydrogen peroxide aqueous solution in Examples 3 to 5 and Comparative Examples 3 and 4.

Meanwhile, Table 2 shows a relationship of the variation amounts with the polishing amount, evaluating the in-plane thickness variations of the silicon films before and after the CMP polishing step performed on the SOI wafers in Examples 5 to 7 and Comparative Examples 5 and 6.

Figure 7:
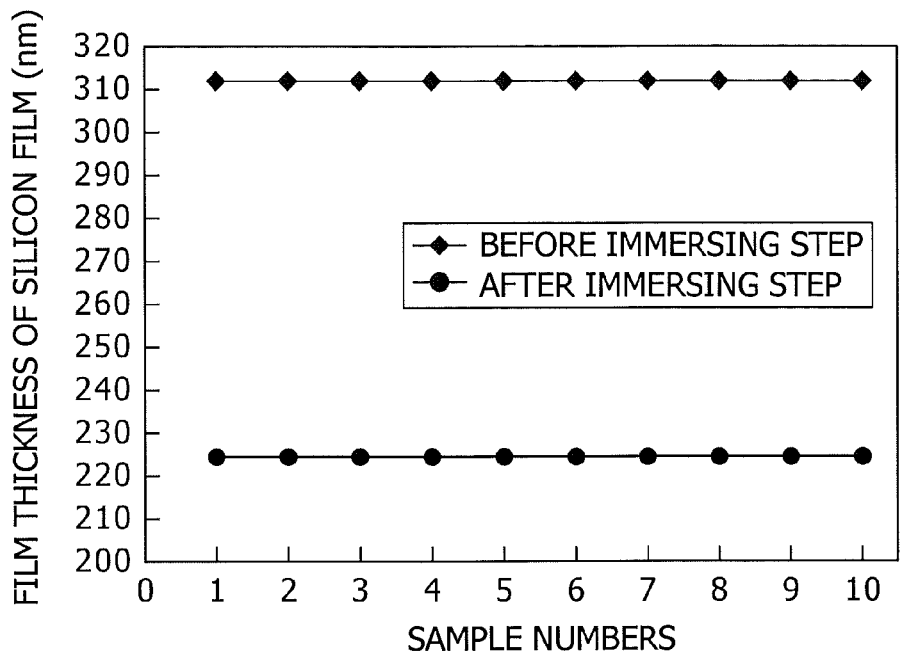
FIG. 7 is a drawing for comparing how much the thicknesses of silicon thin films of post-peeling SOI wafers in Example 6 are changed before and after a step of immersing in an aqueous ammonia-hydrogen peroxide solution.

Moreover, FIG. 7 shows a drawing for comparing how much the thicknesses of the silicon films of the post-peeling SOI wafers in Example 6 were changed before and after the step of immersing in the aqueous ammonia-hydrogen peroxide solution.

Figure 8:
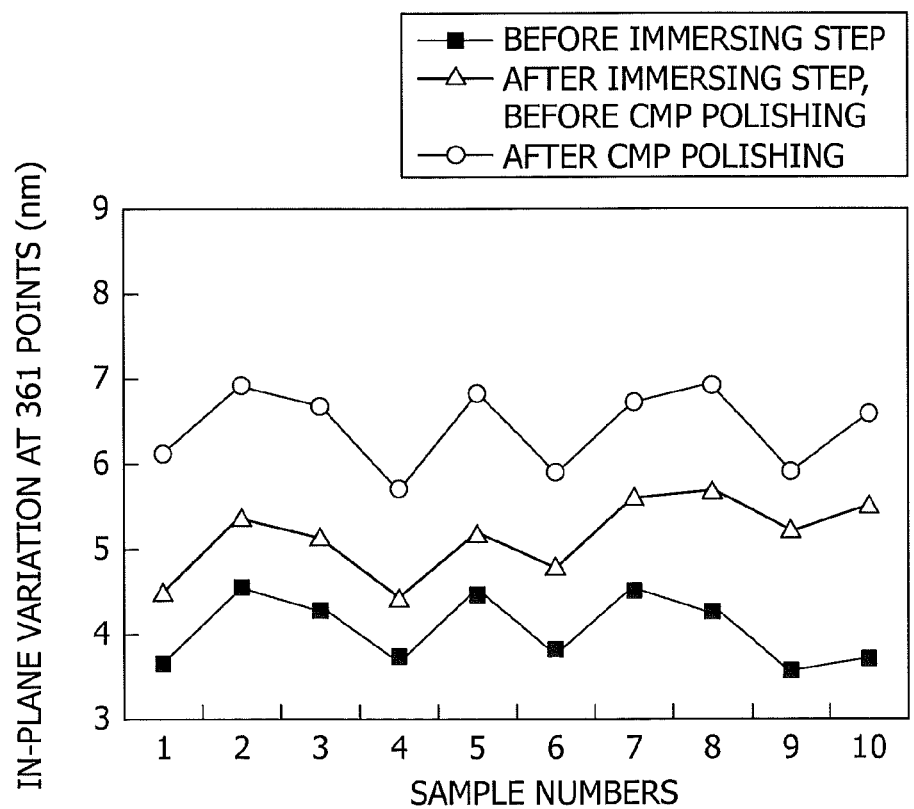
FIG. 8 is a drawing for comparing how much the in-plane thickness variations of the silicon thin films of the post-peeling SOI wafers in Example 6 are changed before and after the immersing step as well as before and after a CMP polishing step.

Moreover, FIG. 8 shows a drawing for comparing how much the in-plane thickness variations of the silicon films of the post-peeling SOI wafers in Example 6 were changed before and after the immersing step as well as before and after the CMP polishing step.

TABLE 1

| | Etching amount [nm] | In-plane thickness variation [nm] | |
|---|---|---|---|
| | | Before immersion | After immersion |
| Comparative Example 3 | 30 | 4.0 | 5.8 |
| Comparative Example 4 | 40 | 4.1 | 6.0 |
| Example 3 | 50 | 4.0 | 5.1 |
| Example 4 | 70 | 4.0 | 5.2 |
| Example 5 | 85 | 4.1 | 5.3 |

As shown in Table 1, the in-plane thickness variations of the silicon films of the post-peeling SOI wafers before and after the immersion in the aqueous ammonia-hydrogen peroxide solution were respectively changed from 4.0 nm to 5.1 nm in Example 3, from 4.0 nm to 5.2 nm in Example 4, from 4.1 nm to 5.3 nm in Example 5, from 4.0 nm to 5.8 nm in Comparative Example 3, and from 4.1 nm to 6.0 nm in Comparative Example 4.

As can be seen, it has been found that when the amount of etching by the aqueous ammonia-hydrogen peroxide solution is 50 nm or more, the in-plane variation of the silicon film of the post-peeling SOI wafer can be suppressed.

TABLE 2

| | Polishing amount [nm] | In-plane thickness variation [nm] | |
|---|---|---|---|
| | | Before polishing | After polishing |
| Example 5 | 10 | 5.3 | 5.5 |
| Example 6 | 25 | 5.2 | 6.5 |
| Example 7 | 50 | 5.1 | 7.2 |
| Comparative Example 5 | 60 | 5.3 | 10.2 |
| Comparative Example 6 | 70 | 5.1 | 11.6 |

As shown in Table 2, the in-plane thickness variations of the silicon films of the post-peeling SOI wafers before and after the CMP polishing step were changed from 5.3 nm to 5.5 nm in Example 5, from 5.2 nm to 6.5 nm in Example 6, from 5.1 nm to 7.2 nm in Example 7, from 5.3 nm to 10.2 nm in Comparative Example 5, and from 5.1 nm to 11.6 nm in Comparative Example 6, respectively.

As can be seen, it has been found that when the silicon film of the post-peeling SOI wafer etched by 50 nm or more with the aqueous ammonia-hydrogen peroxide solution is polished by 50 nm or less through the CMP polishing, an SOI wafer excellent in thickness uniformity with the variation of 10 mm or less can be manufactured. Note that, the CMP polishing was not able to achieve the polished amount of 10 nm or less.

When the thicknesses of the silicon films of the post-peeling SOI wafers in Example 6 were evaluated before and after the etching with the aqueous ammonia-hydrogen peroxide solution, it was found out as shown in FIG. 7 that, there were fewer variations among the post-peeling SOI wafers. This reveals that etching can be performed in a consistent manner with the aqueous ammonia-hydrogen peroxide solution.

Additionally, FIG. 8 shows the change in the thickness variations of the silicon films of the post-peeling SOI wafer before and after the immersing step as well as before and after the polishing step.

The variation in in-plane thickness of the silicon films of the post-peeling SOI wafers in Example 6 increased only by approximately 2 nm, even after the SOI wafer was etched by 85 nm with the aqueous ammonia-hydrogen peroxide solution. This is sufficiently small in comparison with the etching amount, and is thus a practical value. Moreover, the variation in in-plane thickness of the silicon films after the CMP polishing is also shown in FIG. 8. It was found out that the thickness variation after the CMP polishing fell within approximately 7 nm at maximum. This value is also a sufficiently small value relative to the polishing amount so that an SOI wafer excellent in in-plane thickness uniformity is obtained.

As described above, a post-peeling SOI wafer peeled by an ion implantation peeling method is immersed in an aqueous ammonia-hydrogen peroxide solution and thus etched by 50 nm or more; thereafter, the SOI wafer is polished by 10 to 50 nm through CMP polishing. In this manner, it is possible to obtain an SOI wafer in which the variation in in-plane thickness is suppressed in comparison with SOI wafers thinned by a conventional method.

It should be noted that the present invention is not limited to the above-described embodiments. The embodiments are exemplary, and any means having substantially the same configuration as and exhibiting similar operations and effects to those of a technological idea described in scope of claims of the present invention are included in the technological scope of the present invention.

The invention claimed is:

1. A method for manufacturing an SOI wafer, comprising at least the steps of:
    bonding a silicon wafer with or without an oxide film onto a handle wafer to prepare a bonded substrate, wherein the silicon wafer has an ion implanted layer formed by implanting hydrogen ions and/or rare gas ions into the silicon wafer;
    peeling the silicon wafer along the ion implanted layer, thereby transferring the silicon wafer onto the handle wafer to produce a post-peeling SOI wafer;
    immersing the post-peeling SOI wafer in an aqueous ammonia-hydrogen peroxide solution; and
    performing a heat treatment at a temperature of 900° C. or higher on the immersed post-peeling SOI wafer, and/or polishing a silicon film layer of the immersed post-peeling SOI wafer, through CMP polishing by 10 to 50 nm,
    wherein the aqueous ammonia-hydrogen peroxide solution contains, based on a volume composition ratio, at least: 0.05 to 2 of 29 wt % ammonia water; 0.01 to 0.5 of 30 wt % hydrogen peroxide water; and 10 of water.

2. The method for manufacturing an SOI wafer according to claim 1, wherein
    the heat treatment step is performed after the step of immersing, and
    the step of immersing comprises at least etching the post-peeling SOI wafer by 20 nm or more.

3. The method for manufacturing an SOI wafer according to claim 2, wherein the step of immersing comprises at least etching the post-peeling SOI wafer by 50 nm or more.

4. The method for manufacturing an SOI wafer according to claim 1, wherein the handle wafer comprises at least one material of silicon, sapphire, alumina, quartz, SiC, aluminum nitride, and glass.

5. The method for manufacturing an SOI wafer according to claim 1, wherein the heat treatment step is performed in any atmosphere of argon, nitrogen, and helium, or in a gas mixture atmosphere thereof.

6. The method for manufacturing an SOI wafer according to claim 1, wherein the heat treatment step is performed in an oxygen atmosphere, or in a mixture atmosphere of oxygen and at least one gas of argon, nitrogen and helium.

7. The method for manufacturing an SOI wafer according to claim 1, wherein the heat treatment step is performed in a hydrogen atmosphere, or in a mixture atmosphere of hydrogen and at least one gas of argon, nitrogen and helium.

8. The method for manufacturing an SOI wafer according to claim 1, wherein the step of immersing comprises at least etching the post-peeling SOI wafer by 50 nm or more.

9. The method for manufacturing an SOI wafer according to claim 2, wherein the handle wafer comprises at least one material of silicon, sapphire, alumina, quartz, SiC, aluminum nitride, and glass.

10. The method for manufacturing an SOI wafer according to claim 2, wherein the heat treatment step is performed in any atmosphere of argon, nitrogen, and helium, or in a gas mixture atmosphere thereof.

11. The method for manufacturing an SOI wafer according to claim 2, wherein the heat treatment step is performed in an oxygen atmosphere, or in a mixture atmosphere of oxygen and at least one gas of argon, nitrogen and helium.

12. The method for manufacturing an SOI wafer according to claim 2, wherein the heat treatment step is performed in a hydrogen atmosphere, or in a mixture atmosphere of hydrogen and at least one gas of argon, nitrogen and helium.

* * * * *